United States Patent
Lin

(10) Patent No.: US 9,659,782 B2
(45) Date of Patent: May 23, 2017

(54) MEMORY DEVICE AND METHOD FOR FABRICATING THE SAME

(71) Applicant: UNITED MICROELECTRONICS CORP., Hsin-Chu (TW)

(72) Inventor: Sung-Bin Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/616,747

(22) Filed: Feb. 9, 2015

(65) Prior Publication Data

US 2016/0197156 A1   Jul. 7, 2016

(30) Foreign Application Priority Data

Jan. 7, 2015   (TW) .............................. 104100444 A

(51) Int. Cl.
| | | |
|---|---|---|
| H01L 29/792 | (2006.01) | |
| H01L 21/28 | (2006.01) | |
| H01L 29/423 | (2006.01) | |
| H01L 29/66 | (2006.01) | |
| H01L 29/788 | (2006.01) | |

(52) U.S. Cl.
CPC .. *H01L 21/28273* (2013.01); *H01L 29/42324* (2013.01); *H01L 29/66825* (2013.01); *H01L 29/7881* (2013.01)

(58) Field of Classification Search
CPC ........................ H01L 29/42368; H01L 29/51
See application file for complete search history.

(56) References Cited

U.S. PATENT DOCUMENTS

| | | | | |
|---|---|---|---|---|
| 6,507,073 B1 * | 1/2003 | Hishinuma | ....... | H01L 21/28211 257/316 |
| 7,825,018 B2 | 11/2010 | Sasaki | | |
| 2003/0003657 A1 * | 1/2003 | Kim | .................. | H01L 21/28273 438/257 |
| 2004/0051151 A1 * | 3/2004 | Dang | ................ | H01L 29/78621 257/408 |
| 2006/0081916 A1 * | 4/2006 | Sohn | ................. | H01L 21/28273 257/321 |
| 2010/0117141 A1 * | 5/2010 | Shin | ........................ | G11C 5/02 257/326 |

\* cited by examiner

*Primary Examiner* — Marc Armand
*Assistant Examiner* — Sarah Salerno
(74) *Attorney, Agent, or Firm* — Winston Hsu; Scott Margo

(57) ABSTRACT

A method for fabricating memory device is disclosed. The method includes the steps of: providing a substrate having a tunnel oxide layer on the substrate, a first electrode layer on the tunnel oxide layer, an oxide-nitride-oxide (ONO) stack on the first electrode layer, and a second electrode layer on the ONO stack, and then removing part of the second electrode layer, part of the ONO stack, and part of the first electrode layer so that the tunnel oxide layer is not exposed.

6 Claims, 3 Drawing Sheets

MEMORY DEVICE AND METHOD FOR FABRICATING THE SAME

BACKGROUND OF THE INVENTION

1. Field of the Invention

The invention relates to a memory device, and more particularly, to a memory device having U-shaped dielectric layer between floating gate and substrate.

2. Description of the Prior Art

A flash memory is a type of non-volatile memory, which can preserve data within the memory even when an external power supply is off. Recently, because flash memories are electrically re-writable and electrically re-erasable, they have been widely applied in the fabrication of electrical products, such as mobile phones, digital cameras, video players, personal digital assistants (PDA) or systems on a chip (SOC).

However, issues such as encroachment in oxide-nitride-oxide (ONO) stack and tunnel oxide layer is often observed during the fabrication of flash memory thereby affecting the operation and performance of the entire device substantially. Hence, how to improve the architecture and process of current flash memory thereby improving the endurance of the device has become an important task in this field.

SUMMARY OF THE INVENTION

According to a preferred embodiment of the present invention, a method for fabricating memory device is disclosed. The method includes the steps of: providing a substrate having a tunnel oxide layer on the substrate, a first electrode layer on the tunnel oxide layer, an oxide-nitride-oxide (ONO) stack on the first electrode layer, and a second electrode layer on the ONO stack, and then removing part of the second electrode layer, part of the ONO stack, and part of the first electrode layer so that the tunnel oxide layer is not exposed.

According to another aspect of the present invention, a memory device is disclosed. The memory device includes: a substrate having a first electrode layer on the substrate, an oxide-nitride-oxide (ONO) stack on the first electrode layer, and a second electrode layer on the ONO stack; a spacer adjacent to the second electrode layer, the ONO stack, and part of the first electrode layer; and a U-shaped dielectric layer between the first electrode layer and the substrate.

According to another aspect of the present invention, a memory device is disclosed. The memory device includes: a substrate having a first electrode layer on the substrate, an oxide-nitride-oxide (ONO) stack on the first electrode layer, and a second electrode layer on the ONO stack; a spacer adjacent to the second electrode layer, the ONO stack, and part of the first electrode layer, and a tunnel oxide layer between the first electrode layer and the substrate. Preferably, the bottom of the spacer is not aligned with the surface of the substrate These and other objectives of the present invention will no doubt become obvious to those of ordinary skill in the art after reading the following detailed description of the preferred embodiment that is illustrated in the various figures and drawings.

DETAILED DESCRIPTION

Figure 1:
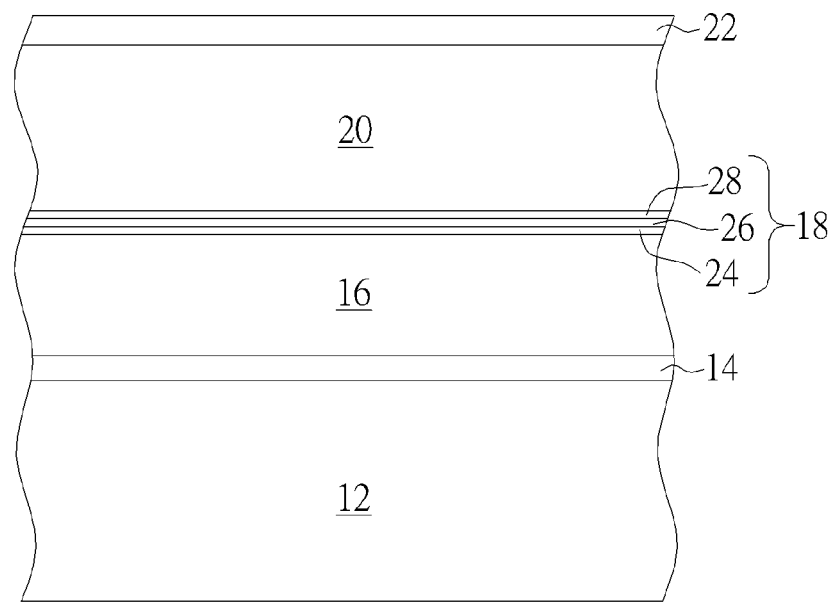
FIGS. 1-5 illustrate a method for fabricating memory device according to a preferred embodiment of the present invention.

Referring to FIGS. 1-5, FIGS. 1-5 illustrate a method for fabricating memory device according to a preferred embodiment of the present invention. As shown in FIG. 1, a substrate 12, such as a substrate composed of silicon, GaAs, silicon-on-insulator (SOI) layer, epitaxial layer, silicon germanium layer, or other semiconductor material is provided, and a tunnel oxide layer 14, a first electrode layer 16, an oxide-nitride-oxide (ONO) stack 18, a second electrode layer 20, and a hard mask 22 are sequentially formed on the substrate 12, in which the ONO stack 18 is preferably composed of an oxide layer 24, a nitride layer 26, and an oxide layer 28. In this embodiment, the first electrode layer 16 and the second electrode layer 20 are preferably composed of polysilicon, and the hard mask 22 is selected from the group consisting of $SiO_2$, SiN, SiON, and SiCN, but not limited thereto.

Figure 2:
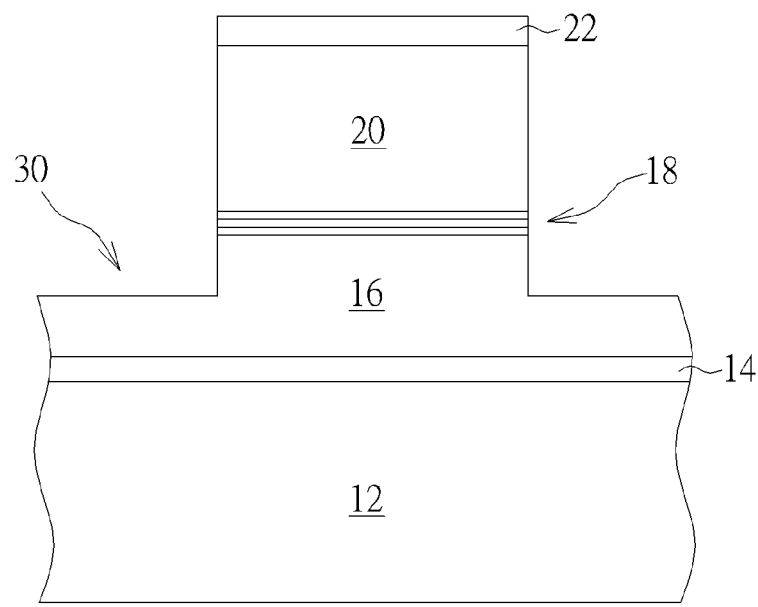

Next, as shown in FIG. 2, part of the hard mask 22, part of the second electrode layer 20, part of the ONO stack 18, and part of the first electrode layer 16 are removed so that the surface of the tunnel oxide layer 14 is not exposed. In this embodiment, the removal of part of the hard mask 22, part of the second electrode layer 20, part of the ONO stack 18, and part of the first electrode layer 16 is accomplished by first forming a patterned resist (not shown) on the hard mask 22, and an etching process is conducted by using the patterned resist as mask to remove part of the hard mask 22, part of the second electrode layer 20, part of the ONO stack 18, and part of the first electrode layer 16 through single or multiple etching processes. Preferably, the etching process is stopped on the first electrode layer 16 while not exposing the tunnel oxide layer 14 underneath. Structurally, instead of having completely vertical sidewalls as the second electrode layer 20 and ONO stack 18 after the etching process, each of the left and right sidewalls of the first electrode layer 16 reveals a step-shaped profile 30, or a L-shaped or reverse L-shaped profile on each of the sidewalls.

It should be noted that even though a patterned resist is used directly for performing the aforementioned etching process, it would also be desirable to use the patterned resist to first pattern the hard mask 22, stripping the patterned resist, and then using the patterned hard mask 22 to etch part of the second electrode layer 20, part of the ONO stack 18, and part of the first electrode layer 16 underneath as the etching process is also stopped on the first electrode layer 16 without exposing the tunnel oxide layer 14 surface, which is also within the scope of the present invention.

Figure 3:
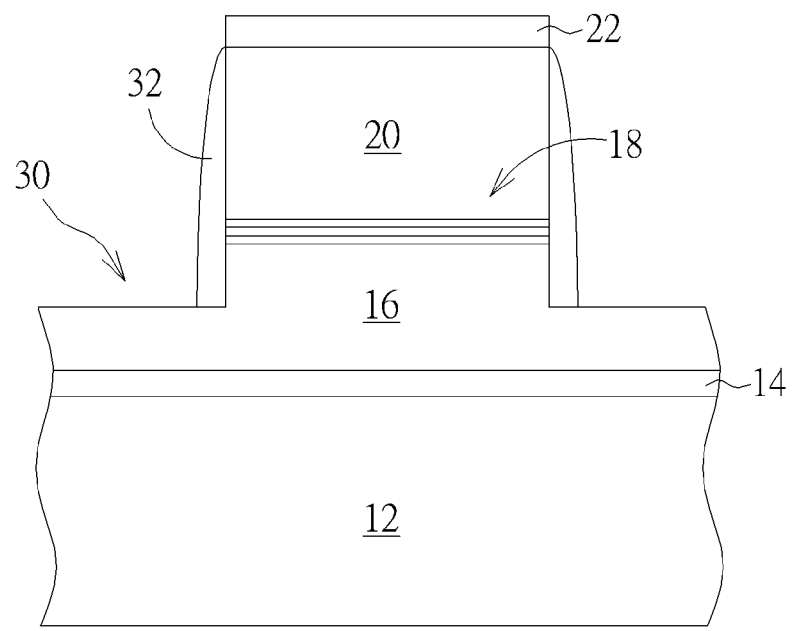

Next, as shown in FIG. 3, a spacer 32 is formed adjacent to the patterned second electrode layer 20, ONO stack 18, and part of the first electrode layer 16. In this embodiment, the formation of the spacer 32 could be accomplished by first depositing a dielectric layer (not shown) on the surface of the step-shaped profile 30, the ONO stack 18 sidewalls, the second electrode layer 20 sidewalls, and the top surface and sidewalls of the hard mask 22, and then conducting an etching back process to remove part of the dielectric layer for forming the spacer 32. In this embodiment, the spacer 32 is selected from the group consisting of $SiO_2$, SiN, SiON, and SiCN, and could be a single layered structure or multi-layered structure, which are all within the scope of the present invention.

Figure 4:
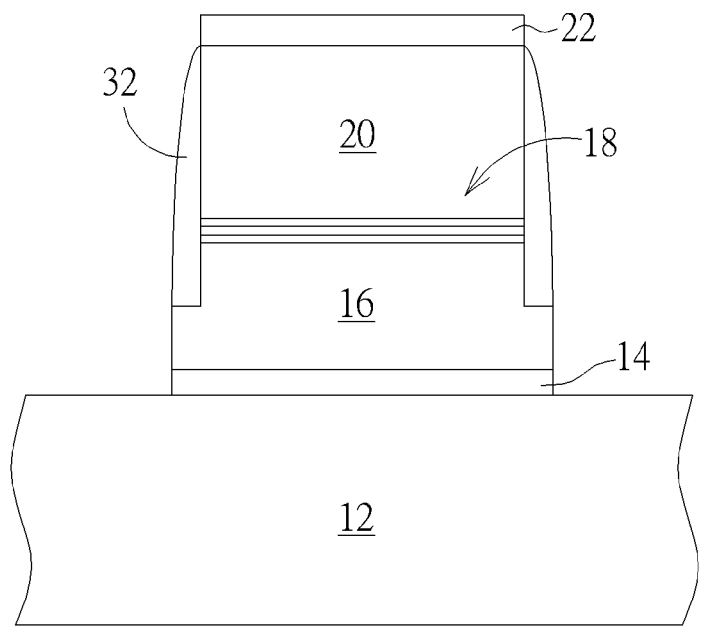

Next, as shown in FIG. 4, another etching process is conducted by using the hard mask 22 and spacer 32 as mask to remove part of the first gate electrode layer 16 and tunnel oxide layer 14 so that an edge of the spacer 32 is even with an edge of the first gate electrode layer 16 and tunnel oxide layer 14.

Figure 5:
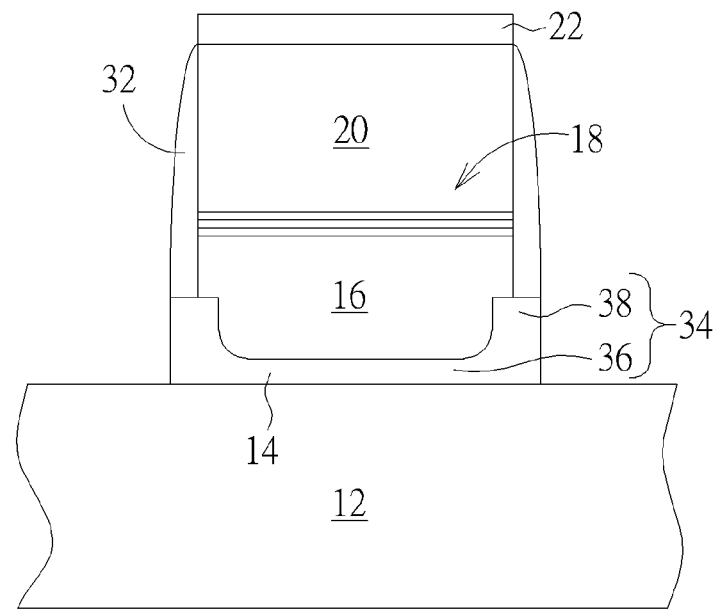

Next, as shown in FIG. 5, a re-oxidation process is conducted to form a U-shaped dielectric layer 34 composed of silicon oxide under and adjacent to the first electrode layer 16 and directly under the spacer 32, in which the bottom of the spacer 32 is preferably aligned with the tips of the U-shaped dielectric layer 34 and the bottom of the U-shaped dielectric layer 34 includes the tunnel oxide layer 14. Specifically, the U-shaped dielectric layer 34 includes a horizontal portion 36 and two vertical portions 38, in which the horizontal portion 36 includes the tunnel oxide layer 14, the tips of the two vertical portions 38 preferably contact and align with the bottom of the spacer 32, and the corner connecting the horizontal portion 36 and the two vertical portions 38 preferably include a curve. In this embodiment, the bottom width of the spacer 32 is preferably less than the top width of each vertical portion 38, or the outer sidewall of each vertical portion 38 is aligned with the outer sidewall of the spacer 32 while the inner sidewall each vertical portion 38 is not aligned with the inner sidewall of the spacer 32 so that a step-shaped profile is observed between the bottom of the inner sidewall of spacer 32 and the inner top portion of the vertical portion 38. Moreover, the top surface of the two vertical portions 38 is preferably lower than 20% height of the first electrode layer 16, or more preferably at around 10% height of the first electrode layer 16. This completes the fabrication of a memory device according to a preferred embodiment of the present invention, in which the first electrode layer 16 is preferably used as a floating gate while the second electrode layer 20 is used as a control gate. Next, elements including source/drain regions and select gates could be formed thereafter, and the details of which are not explained herein for the sake of brevity.

Figure 6:
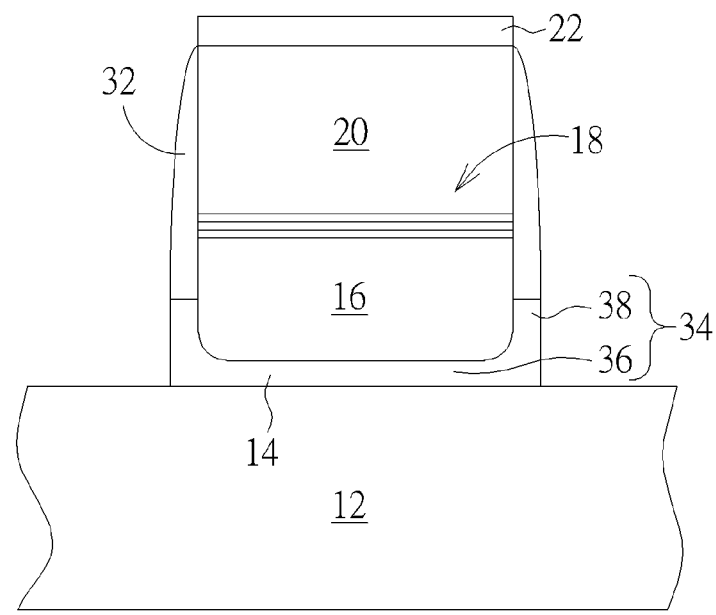
FIG. 6 illustrates a structural view of a semiconductor device according to an embodiment of the present invention.

It should be noted that in alternative to the embodiment shown in FIG. 5, another embodiment of the present invention, as shown in FIG. 6, could adjust the width of the two vertical portions 38 so that the width of each tip of the vertical portions 38 is equivalent to the bottom width of the spacer 32, or both inner and outer sidewalls of each vertical portion 38 are aligned with inner and outer sidewalls of the spacer 32, which is also within the scope of the present invention.

Referring again to FIG. 5, which further discloses a memory device structure according to a preferred embodiment of the present invention. As shown in FIG. 5, the semiconductor device includes a substrate 12, a first electrode layer 16 on the substrate 12, a ONO stack 18 on the first electrode layer 16, a second electrode layer 20 on the ONO stack 18, a hard mask 22 on the second electrode layer 20, a spacer 32 adjacent to the second electrode layer 20, ONO stack 18, and part of the first electrode layer 16, and a U-shaped dielectric layer 34 between the first electrode layer 16 and the substrate 12.

In this embodiment, the U-shaped dielectric layer 34 includes a horizontal portion 36 and two vertical portions 38 adjacent to two ends of the horizontal portion 36, in which part of the horizontal portion 36 includes a tunnel oxide layer 14 and the height of the two vertical portions 38 is preferably lower than 20% of the overall height of the first electrode layer 16, or more preferably around 10% of the overall height of the first electrode layer 16. Viewing from another perspective, the bottom surface of the spacer 32 is preferably not aligned with the surface of the substrate 12 or does not contact the surface of the substrate 12, or the bottom of the spacer 32 is preferably between the ONO stack 18 and the tunnel oxide layer 14. Moreover, each of the hard mask 22 and spacer 32 could be selected from the group consisting of $SiO_2$, SiN, SiON, and SiCN, but not limited thereto.

Overall, the present invention discloses an approach of only etching part of control gate, part of ONO stack, and part of floating gate without exposing the tunnel oxide layer underneath so that a re-oxidation process could be conducted to form a U-shaped dielectric layer between floating gate and substrate after spacer is formed. It would also be desirable to control the ONO stack to have a planar profile while two ends of the tunnel oxide layer revealing slightly protruding upward profile. Preferably, the design of the present invention could maintain stable electron transmission and better coupling during writing and erase operation of the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a substrate having a first electrode layer on the substrate, an oxide-nitride-oxide (ONO) stack on the first electrode layer, and a second electrode layer on the ONO stack;
   a spacer adjacent to the second electrode layer, the ONO stack, and part of the first electrode layer; and
   a U-shaped dielectric layer between the first electrode layer and the substrate, wherein the U-shaped dielectric layer comprises a vertical portion and a horizontal portion, a top surface of the vertical portion comprises a planar surface and contacting the spacer and the first gate electrode layer directly, and a width of the top surface of the vertical portion is greater than or equal to a width of a bottom surface of the spacer.

2. The memory device of claim 1, further comprising a hard mask on the second electrode layer.

3. The memory device of claim 2, wherein the hard mask is selected from the group consisting of $SiO_2$, SiN, SiON, and SiCN.

4. The memory device of claim 1, wherein the U-shaped dielectric layer comprises a tunnel oxide layer.

5. The memory device of claim 1, wherein the U-shaped dielectric layer comprises a horizontal portion and two vertical portions, and the top surface of the two vertical portions is lower than 20% height of the first electrode layer.

6. A memory device, comprising:
   a substrate having a first electrode layer on the substrate, an oxide-nitride-oxide (ONO) stack on the first electrode layer, and a second electrode layer on the ONO stack;
   a spacer adjacent to the second electrode layer, the ONO stack, and part of the first electrode layer; and
   a U-shaped dielectric layer between the first electrode layer and the substrate, wherein the U-shaped dielectric layer comprises a vertical portion and a horizontal portion, a top surface of the vertical portion comprises a planar surface, and a width of the top surface of the vertical portion is equal to a width of a bottom surface of the spacer.

* * * * *